(12) United States Patent
Morioka et al.

(10) Patent No.: US 7,576,967 B2
(45) Date of Patent: Aug. 18, 2009

(54) ELECTROSTATIC CHUCK

(75) Inventors: Ikuhisa Morioka, Handa (JP);
Yasufumi Aihara, Nagoya (JP);
Hideyoshi Tsuruta, Tokai (JP)

(73) Assignee: NGK Insulators, Ltd., Nagoya-shi (JP)

( * ) Notice: Subject to any disclaimer, the term of this patent is extended or adjusted under 35 U.S.C. 154(b) by 0 days.

(21) Appl. No.: 11/687,824

(22) Filed: Mar. 19, 2007

(65) Prior Publication Data
US 2007/0223175 A1 Sep. 27, 2007

(30) Foreign Application Priority Data
Mar. 24, 2006 (JP) .............................. 2006-084219

(51) Int. Cl.
*H01T 23/00* (2006.01)

(52) U.S. Cl. ...................... 361/234; 361/230

(58) Field of Classification Search .......... 361/230–234
See application file for complete search history.

(56) References Cited

U.S. PATENT DOCUMENTS 5,250,137 A * 10/1993 Arami et al. ........... 156/345.44
5,255,153 A * 10/1993 Nozawa et al. .............. 361/234
5,625,526 A * 4/1997 Watanabe et al. ........... 361/234
6,133,557 A * 10/2000 Kawanabe et al. .......... 219/544
6,259,592 B1 * 7/2001 Ono ........................... 361/234
7,361,230 B2 * 4/2008 Natsuhara et al. ........... 118/728
2005/0130550 A1* 6/2005 Ponard et al. ................. 445/46
2005/0215073 A1 9/2005 Nakamura et al.

FOREIGN PATENT DOCUMENTS

| CN | 1674247 | 9/2005 |
|---|---|---|
| JP | 07-074234 A1 | 3/1995 |
| JP | 07-273175 | 10/1995 |
| JP | 2836986 | 10/1998 |
| JP | 2000-100916 | 4/2000 |
| JP | 2001338970 A * | 12/2001 |
| JP | 2002-047067 | 2/2002 |

\* cited by examiner

*Primary Examiner*—Danny Nguyen
(74) *Attorney, Agent, or Firm*—Burr & Brown

(57) ABSTRACT

An electrostatic chuck includes a ceramic base having an electrode embedded in vicinity to a holding face for holding a substrate. On a back side of this ceramic base, provided are a terminal connected to the electrode, a wafer temperature control member, and an insulating member for insulating the temperature control member from the terminal. This insulating member has a flange portion on its end portion in contact with the ceramic base, and is made of highly thermal conductive ceramics.

5 Claims, 1 Drawing Sheet

ELECTROSTATIC CHUCK

CROSS-REFERENCE TO RELATED APPLICATION

This application is based upon and claims the benefit of priority from Patent Application No. 2006-84219 filed on Mar. 24, 2006, in the Japanese Patent Office, of which the contents are incorporated herein by reference.

BACKGROUND OF THE INVENTION

1. Field of the Invention

The present invention relates to an electrostatic chuck.

2. Description of Related Art

In the processes of semiconductor device fabrication, a surface of a semiconductor wafer as a substrate undergoes various processes such as deposition, heating and etching. When these processes are performed, an electrostatic chuck is used to hold the semiconductor wafer. This electrostatic chuck holds the semiconductor wafer by generating electrostatic force between a holding face of the electrostatic chuck and the semiconductor wafer set on the holding face. Electrostatic chucks have advantages of fewer limitations on usable environments and smaller risks of particles generation and wafer pollution than those devices which hold a semiconductor wafer with vacuum suction or those devices which mechanically hold a semiconductor wafer.

An electrostatic chuck generally includes a ceramic base in which an electrode for causing electrostatic force is embedded in vicinity to the holding face for holding a substrate. This electrode in the ceramic base is connected to a terminal inserted through an introduction hole formed in a back face, which is the reverse side of the holding face. Electric power is externally supplied to this terminal, whereby electrostatic force is caused on the holding face of the ceramic base. Such an electrostatic chuck is described in, for example, the specification of Japanese Patent No. 2836986.

In the course of semiconductor device fabrication, when various processes are carried out on a semiconductor substrate held onto an electrostatic chuck, this semiconductor substrate needs to be kept at a given temperature. To this end, a temperature control member, such as a heater or cooling jacket, is disposed in contact with the back face of the electrostatic chuck, and the temperature of the surface of the semiconductor substrate held onto this electrostatic chuck is controlled to be constant by the heat transfer across this temperature control member and the electrostatic chuck. This temperature control member has a penetrating hole through which the above-mentioned terminal to be connected to the electrostatic chuck is inserted.

For this temperature control member, a metal member is used in many cases, with the intention of accomplishing favorable heat transfer to the electrostatic chuck. This metal temperature control member needs to be electrically insulated from the terminal, which is attached to the back face of the electrostatic chuck and is supplied with electric power. Therefore, in the penetrating hole, formed in the temperature control member to allow the terminal to pass therethrough, and its vicinity, an insulating member is provided so as to cover the terminal.

One of the properties required of the insulating member interposed between the terminal and the temperature control member is an insulating property between the terminal and the temperature control member. To cause desired electrostatic force on the holding face of the ceramic base, the terminal is supplied with a voltage of, for example, approximately 500 V in the case of a Johnson-Rahbeck-type electrostatic chuck, or approximately 3000 V in the case of a Coulomb-type electrostatic chuck. The insulating member is required to be capable of sufficiently insulating the temperature control member from the terminal, which is supplied with such a voltage.

In recent years, for more reliable and stable insulation, a need has arisen to increase the insulating performance by means of an insulating member. Here, to accomplish high insulating performance between the terminal and the temperature control member, it is necessary that the dielectric voltage of the insulating member itself be high, and that no creeping discharge occur in an area where an end face of the insulating member is in contact with the back face of the ceramic base. To meet the former need to increase the dielectric voltage of the insulating member itself, it is effective to use a material with high dielectric voltage for the insulating member, or to increase the thickness of the insulating member. To meet the later need to prevent the occurrence of a creeping discharge, it is effective to secure a sufficient creepage distance.

However, to thicken the insulating member or to increase the creepage distance, it is necessary to widen the diameter of the penetrating hole, which is formed in the temperature control member, through which the terminal is inserted, and on which the insulating member is provided. If the diameter of this penetrating hole is made larger, a part of the ceramic base facing this penetrating hole is not in contact with the temperature control member, with the result that the heating temperature in this part is locally different from the heating temperature in the other part. Accordingly, the uniformity of temperature of a wafer held onto the electrostatic chuck is degraded. As a result, for example, the etching rate and etching shape in the etching process are degraded, leading to the possibility that a device failure might occur in the processed wafer.

On the other hand, if the above-mentioned diameter of the penetrating hole is made smaller, degradation in the uniformity of wafer temperature as described above does not occur, but the thickness of the insulating member interposed between the terminal and the temperature control member, or the creepage distance becomes insufficient, leading to the possibility that an insulation failure might occur.

Therefore, according to the conventional techniques, it has been difficult to achieve good characteristics both in the uniformity of wafer temperature and in the insulating performance of an insulating member.

The present invention is made to advantageously solve the above described problems, and an object of the present invention is to provide an electrostatic chuck that can obtain good characteristics both in the uniformity of wafer temperature and in the insulating performance of an insulating member.

SUMMARY OF THE INVENTION

An electrostatic chuck according to the present invention to achieve the above object includes: a ceramic base having an electrode embedded approximately in parallel with and in vicinity to a holding face for holding a substrate; a terminal that is inserted through a penetrating hole formed in a back face, which is the reverse side of the holding face of this ceramic base, and connected to the electrode; a temperature control member that is in contact with the back face of this ceramic base; and an insulating member that is provided around this terminal and insulates the temperature control member from this terminal, wherein this insulating member has a flange portion in its end portion in contact with the ceramic base.

According to the electrostatic chuck of the present invention, it is possible to accomplish both high insulating performance between the terminal and the temperature control member and high uniformity of wafer temperature. Accordingly, it is possible to enhance the reliability of the electrostatic chuck and to realize the surface uniformity during processes such as wafer etching.

BRIEF DESCRIPTION OF THE DRAWINGS

The above and further objects, features and advantages of the invention will more fully appear in the detailed description of embodiments of the invention, when the same is read in conjunction with the drawings, in which.

DETAILED DESCRIPTION OF THE INVENTION

Hereinafter, an embodiment of the present invention will be described with reference to the accompanying drawings. In the following description related to the drawings, the same or similar parts are denoted by the same or similar numerals and symbols. Moreover, it should be noted that the drawings are schematic to facilitate the understanding of the present invention and are not to scale. Therefore, concrete dimensions and the like should be determined with consideration for the following description. In addition, each of the drawings might include a part or parts whose dimensions and/or proportions are different from those of the equivalent part or parts in the other drawings.

Figure 1:
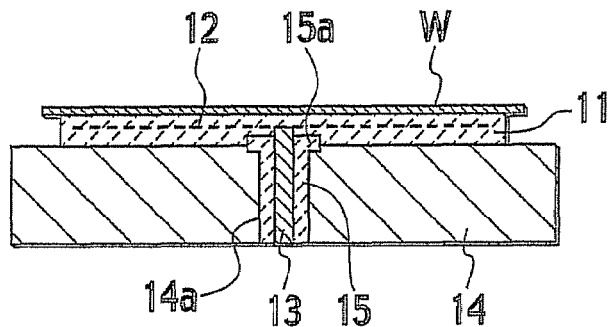
FIG. 1 is a section view showing an embodiment of an electrostatic chuck according to the present invention.
Figure 2:
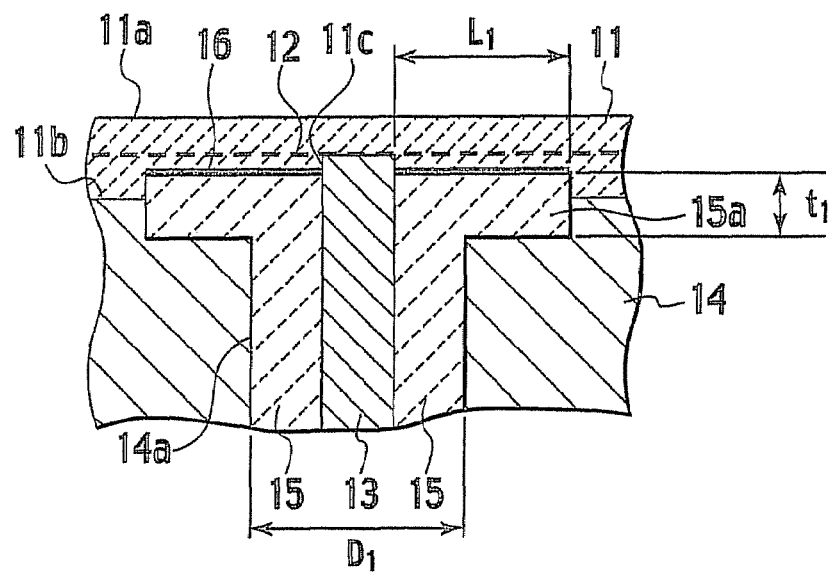
FIG. 2 is an enlarged section view in the vicinity of a central portion of a ceramic base of the electrostatic chuck shown in FIG. 1.

FIG. 1 is a section view showing an embodiment of an electrostatic chuck according to the present invention. The electrostatic chuck shown in FIG. 1 has a disc-shaped ceramic base 11, which holds a wafer W as a substrate by using electrostatic force. FIG. 2 is an enlarged section view in the vicinity of a central portion of this ceramic base 11. In FIGS. 1 and 2, one of the surfaces of the ceramic base 11 is a holding face 11a for holding this wafer W. An electrode 12 for causing the electrostatic force on this holding face 11a is embedded in the ceramic base 11, approximately in parallel with and in vicinity to this holding face 11a. In a back face 11b, which is the reverse side of the holding face 11a of the ceramic base 11, an introduction hole 11c reaching close to the electrode 12 is formed. A terminal 13 is inserted through this introduction hole 11c, whereby the electrode 12 and the terminal 13 are electrically connected. When power is supplied from a power supply (not shown) to the electrode 12 through the terminal 13, an area between the electrode 12 and the holding face 11a in the ceramic base 11 becomes a dielectric layer, which causes electrostatic force on the holding face 11a. Note that the ceramic base 11 may have any one of a structure of a Johnson-Rahbeck-type electrostatic chuck and a structure of a Coulomb-type electrostatic chuck. In addition, a heating element for heating the wafer W may be embedded in the ceramic base 11.

A temperature control member 14 is provided, in contact with almost the entire back face 11b of the ceramic base 11. This temperature control member 14 is for adjusting the temperature of the entire face of this wafer W to a given constant temperature when the wafer W is held onto the holding face 11a of the ceramic base 11. This temperature control member 14 is, for example, a heater with a built-in heating element, or, for example, a cooling jacket in which a refrigerant path is formed. Further, the temperature control member 14 may be a combination of the heater and the cooling jacket.

A penetrating hole 14a through which the above-mentioned terminal 13 can be inserted is formed in a central portion of this temperature control member 14. Inside this penetrating hole 14a and in its vicinity, an approximately cylindrical insulating member 15 for insulating the temperature control member 14 from the terminal 13 is provided around the terminal 13 inserted through the penetrating hole 14a.

This insulating member 15 has a flange portion 15a on its end portion on the side facing the ceramic base 11. An adhesive 16 is applied between an end face of this flange portion 15a and the back face of the ceramic base 11, whereby the insulating member 15 is fixed to the ceramic base 11 with this adhesive 16. The insulating member 15 is made of, for example, aluminum nitride.

According to the electrostatic chuck of the present embodiment, as described above, the insulating member 15 has the flange portion 15a on the end portion facing the ceramic base 11. The length L of the flange portion 15a in the radius direction corresponds to the creepage distance of the insulating member 15. Accordingly, the electrostatic chuck of the present embodiment has a long creepage distance in comparison with a conventional electrostatic chuck having no flange portion and hence gives high insulating performance.

In addition, the thickness t1 of the flange portion 15a is preferably not smaller than 0.5 mm and not greater than 2 mm. Within this thickness range, it is possible to ensure the strength endurable to the stress imposed on the flange portion 15a, and to form no barrier against the movement of heat from the temperature control member 14 to the ceramic base 11. In other words, it is possible to promptly and efficiently transfer the heating or cooling by the temperature control member 14 to the surface of the ceramic base 11 in the vicinity of the terminal 13. Therefore, it is possible to suppress local non-uniformity of the temperature distribution across the wafer, and to achieve uniform temperature distribution across the surface of the wafer.

The dielectric strength characteristic of the insulating member 15 is preferably 5 kV/mm or greater, although it depends on the dimensions and shape of the electrostatic chuck. With a dielectric strength characteristic of 5 kV/mm or greater, stable insulating performance with an allowance can be maintained even if the electrostatic chuck of the present invention is applied to a Coulomb-type electrostatic chuck, to which high voltage is applied. For reference, it is difficult for a conventional electrostatic chuck having no flange portion 15a to ensure a dielectric strength characteristic of 5 kV/mm or greater without degrading the uniformity of temperature. In this point, the electrostatic chuck according to the present invention is advantageous, which can ensure a dielectric strength characteristic of 5 kV/mm or greater without degrading the uniformity of temperature.

The length L1 of the flange portion 15a of the insulating member 15 in the radius direction can be, for example, 3 mm or larger, although it depends on the materials for the ceramic base 11 and the insulating member 15 and the type of the adhesive 16. The larger this length L1, the longer the creepage distance, and hence the higher the insulating performance. However, if the length L1 of the flange portion 15a is too large, the uniformity of wafer temperature might be degraded. Therefore, the length L1 of the flange portion 15a can be appropriately determined depending on the material for the insulating member 15 and the like, with consideration given to an improvement in the insulating performance.

In addition, the material for the insulating member 15 is not particularly limited. An effect intended in the present invention can be obtained as long as the insulating member 15 is in a shape having a flange portion. Nonetheless, the insulating member 15 is preferably made of a material with high thermal conductivity. More preferably, the insulating member 15 is made of highly thermal conductive ceramics in particular. Specifically, the highly thermal conductive ceramics are ceramics having a good thermal conductivity of 15 W/m·K or greater, more preferably, 100 W/m·K or greater. Even if the area of the end face of the insulating member 15 facing the ceramic base 11 becomes larger than in a conventional case due to the provision of the flange portion 15a, the fact that the insulating member 15 is made of highly thermal conductive ceramics makes it possible to reduce the diameter of the hole formed in the temperature control member while maintaining a desired creepage distance. Therefore, it is possible to ensure insulation without impairing the uniformity of temperature. Additionally, higher thermal conductivity of the ceramics is even preferable because the uniformity of temperature can be enhanced. For the highly thermal conductive ceramics, ceramics principally including, for example, aluminum nitride (AlN), alumina ($Al_2O_3$), silicon nitride (SiN), high-resistivity silicon carbide (SiC), or the like can be favorably employed. Among them, aluminum nitride (AlN) in particular has a high thermal conductivity of 100 W/m·K or greater and is therefore advantageous.

In the case of using aluminum nitride for the insulating member 15 in particular, since aluminum nitride is highly thermal conductive, it has an advantage in making the surface temperature of the ceramic base 11 more uniform.

The adhesive 16 for fixing the insulating member 15 to the ceramic base 11 is preferably an adhesive with a high insulating property. The fact that the adhesive 16 is a highly insulating adhesive can further enhance the insulating performance. Moreover, the fact that the adhesive 16 is a highly insulating adhesive can reduce the creepage distance (L1) while maintaining predetermined insulating performance, and therefore can enhance the uniformity of wafer temperature. Specifically, the highly insulating adhesive preferably has a dielectric voltage of 10 kV/mm or greater for the adhesive 16. Adhesives having such a characteristic include, for example, cyanoacrylate-resin adhesives, epoxy-resin adhesives, silicone-resin adhesives, and the like.

As to the diameter of the penetrating hole 14a in the temperature control member 14, the diameter of the hole, facing a portion of the insulating member 15 except the flange portion 15a, is, for example, 5 mm or smaller as in a conventional case, whereby degradation in the uniformity of wafer temperature can be suppressed.

Figure 3:
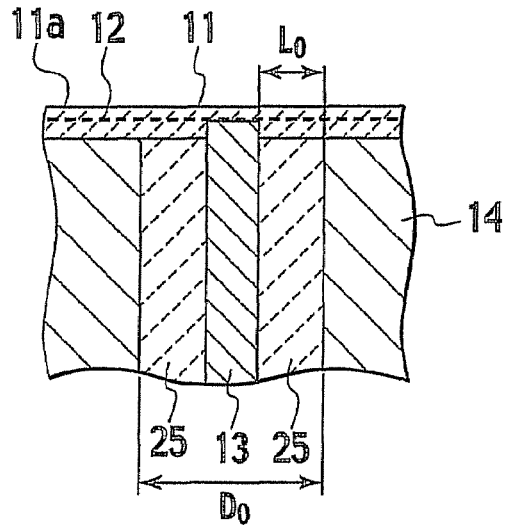
FIG. 3 is an enlarged section view in the vicinity of a central portion of a ceramic base of a conventional electrostatic chuck.

FIG. 3 is a section view in the vicinity of a central portion of a ceramic base 11 of a conventional electrostatic chuck, as a comparative example. Note that in FIG. 3, members of the same types as those shown in FIGS. 1 and 2 are denoted by the same numerals and symbols as in FIGS. 1 and 2, and overlapped description will be omitted below. The electrostatic chuck shown in FIG. 3 is an example in which an insulating member 25 is in a cylindrical shape having no flange portion in the end portion facing the ceramic base 11. In the electrostatic chuck including such an insulating member 25, when the creepage distance L0 is long enough for insulation, the diameter D0 of the penetrating hole 14a in the temperature control member 14 becomes large, degrading the uniformity of temperature. If an attempt is made to ensure the uniformity of wafer temperature by making the diameter D0 of the penetrating hole 14a smaller, the thickness of the insulating member 25, that is, the creepage distance L0 needs to be reduced, degrading the insulating performance.

EXAMPLES

First Examples

Various electrostatic chucks were fabricated in which the ceramic base 11 is made of alumina and the temperature control member 14 is a cooling disc that is an aluminum (Al) disc provided inside with a refrigerant path. When these electrostatic chucks were fabricated, insulating members made of various materials and having various sizes as shown in Table 1 were made, and the electrostatic chucks including these insulating members were assembled. Each of the fabricated electrostatic chucks was set in a vacuum chamber equipped with a lamp heater for simulating a heat input from plasma, and was checked for the insulating performance and the uniformity of wafer temperature. For the insulating performance, it was checked whether or not a dielectric breakdown and a creeping discharge occurred when a voltage of 3 kV was applied to the terminal. For the uniformity of wafer temperature, temperatures on a 300 mm wafer when heated at 70° C. by the lamp heater were measured in an area near the terminal and in the other area, and the temperature difference was checked. These results are also shown in Table 1. Incidentally, for the adhesive for fixing the insulating member to the ceramic base, an epoxy resin with a dielectric voltage of 50 kV/mm and a thermal conductivity of 0.2 W/m·K was used.

TABLE 1

|  | Example 1 | Example 2 | Example 3 | Example 4 | Example 5 | Example 6 | Example 7 |
|---|---|---|---|---|---|---|---|
| Flange material | AlN | AlN | AlN | AlN | $Al_2O_3$ | $Al_2O_3$ | $Al_2O_3$ |
| Thermal conductivity [W/m-K] | 170 | 170 | 100 | 100 | 30 | 30 | 15 |
| Dielectric strength voltage [kV/mm] | 20 | 20 | 20 | 20 | 18 | 18 | 18 |
| Creepage distance(L1) [mm] | 3 | 3 | 3 | 3 | 3 | 3 | 3 |
| Thickness of flange portion(t1) [mm] | 0.5 | 2 | 0.5 | 2 | 0.5 | 2 | 0.5 |
| Dielectric breakdown at 3 kV | No occurrence | No occurrence | No occurrence | No occurrence | No occurrence | No occurrence | No occurrence |
| Creeping discharge at 3 kV | No occurrence | No occurrence | No occurrence | No occurrence | No occurrence | No occurrence | No occurrence |
| Uniformity of wafer temperature [° C.] | 1.1 | 1.6 | 1.2 | 1.9 | 2.7 | 4.2 | 3.1 |
| Remarks |  |  |  |  |  |  |  |

TABLE 1-continued

|  | Example 8 | Comparative Example 6 | Comparative Example 1 | Comparative Example 2 | Comparative Example 3 | Comparative Example 4 | Comparative Example 5 |
|---|---|---|---|---|---|---|---|
| Flange material | $Si_3N_4$ | AlN | Cylindrical member | AlN | AlN | Resin 1 | Resin 1 |
| Thermal conductivity [W/m·K] | 30 | 100 | 30 | 170 | 170 | 0.2 | 0.2 |
| Dielectric strength voltage [kV/mm] | 25 | 20 | 18 | 20 | 20 | 20 | 3 |
| Creepage distance(L1) [mm] | 3 | 3 | — | 2 | 3 | 3 | 3 |
| Thickness of flange portion(t1) [mm] | 0.5 | 3 | — | 2 | 0.3 | 2 | 0.5 |
| Dielectric breakdown at 3 kV | No occurrence | No occurrence | No occurrence | No occurrence | — | No occurrence | Occurrence |
| Creeping discharge at 3 kV | No occurrence | No occurrence | No occurrence | Occurrence | — | No occurrence | — |
| Uniformity of wafer temperature [° C.] | 2.8 | 6.0 | 6.1 | — | — | 7.0 | — |
| Remarks |  |  |  |  | Crack |  |  |

As a result of conducting a creeping discharge test on a ceramic surface, the distance between the terminal and the temperature control member needed to be 3 mm or longer to ensure insulation against a voltage of 3 kV or higher. Therefore, in Examples 1 to 8, the length of the flange portion in the radius direction, that is, the creepage distance ($L_1$) in Table 1 was set at 3 mm, in which case neither dielectric breakdown nor creeping discharge occurred. Moreover, in Examples 1 to 8, as to the diameter of the penetrating hole in the temperature control member, the diameter of the hole facing a portion of the insulating member 15 except the flange portion was 6 mm, and excellent uniformity of wafer temperature could be obtained. Among Examples 1 to 8, each of Examples 1 to 4, in which the material for the insulating member was AlN, achieved a temperature difference (index of the uniformity of wafer temperature) smaller than 2.0° C., and the device yields were more favorable.

On the other hand, Comparative Example 1 is an example in which the insulating member is made of alumina and has no flange portion. Since the distance ($L_0$) between the terminal and the temperature control member was 3 mm, neither dielectric breakdown nor creeping discharge occurred. To secure this distance of 3 mm, a penetrating hole with a diameter (∅) of 10 mm was formed in the temperature control member. Therefore, when temperatures on the wafer were measured, a terminal portion had become a hot spot where the temperature was higher than in the other area by 6.1° C. Therefore, imperfect etching of a semiconductor device occurred when plasma etching was performed on a semiconductor wafer held onto the electrostatic chuck of Comparative Example 1.

Moreover, Comparative Example 2 in which the creepage distance L1 was 2 mm met with the unfavorable result that a creeping discharge occurred, because the insulating performance of the insulating member was insufficient. Furthermore, in Comparative Example 3 in which the thickness t1 of the flange portion was 0.3 mm, a crack occurred in the insulating member due to the stress imposed on this flange portion.

Further, in Comparative Examples 4 and 5 in which the material for the insulating member was a resin with a thermal conductivity of 0.2 W/m·K, because of the poor thermal conductivity, a hot spot where the temperature was 7° C. higher occurred in a terminal portion, and a device held onto the electrostatic chuck resulted in a failure.

Even in the case where the thickness of the flange portion was 3 mm as in Comparative Example 6, a terminal portion became a hot spot where the temperature was 6° C. higher, and imperfect etching of a device occurred.

Second Examples

Next, electrostatic chucks were measured for the insulating performance and the uniformity of wafer temperature, in the case where various adhesives shown in Table 2 were used for the adhesive for fixing the insulating member to the ceramic base. In this measurement, the insulating member was made of AlN (with a thermal conductivity of 170 W/m·K), and the thickness of the flange portion was 0.5 mm. In addition, to clarify the differences among the effects produced by the different kinds of adhesives, the length of the flange portion of the insulating member, that is, the creepage distance ($L_1$) was set at 2 mm. The results of this measurement are also shown in Table 2.

TABLE 2

|  | Example 9 | Example 10 | Example 11 | Example 12 | Comparative Example 7 | Comparative Example 8 |
|---|---|---|---|---|---|---|
| Adhesive | Epoxy #1 | Epoxy #2 | Silicone #1 | Cyanoacrylate #1 | Not used | Silicone #2 |
| Thermal conductivity [W/m·K] | 0.2 | 0.5 | 0.2 | 0.1 | 0.2 | 0.2 |
| Dielectric strength voltage [kV/mm] | 50 | 10 | 25 | 140 | 5 | 5 |
| Dielectric breakdown at 3 kV | No occurrence | No occurrence | No occurrence | No occurrence | — | — |
| Creeping discharge at 3 kV] | No occurrence | No occurrence | No occurrence | No occurrence | Occurrence | Occurrence |
| Uniformity of wafer temperature [° C.] | 0.8 | 0.5 | 0.9 | 1.2 | — | — |

AlN: 170 W/m·K
Flange thickness: 0.5 mm
Creepage distance: 2 mm

As can be seen from the results in Table 2, when an adhesive with a high insulating property was used, a creeping discharge could be prevented even if the creepage distance was reduced, and no dielectric breakdown occurred. Even in the case of a creepage distance of 2 mm, the temperature difference, which is an index of the uniformity of temperature, could be improved to 0.5° C. while sufficient insulating performance was ensured.

Accordingly, the use of an adhesive with a high insulating property makes it possible to obtain better effects of the present invention, as well as enhanced temperature uniformity and enhanced insulating performance of the electrostatic chuck, and hence higher long-term reliability.

Hereinabove, the electrostatic chucks according to the present invention have been described specifically by using the embodiment shown in the drawings and the examples. However, an electrostatic chuck according to the present invention is not limited to these embodiment and examples. For example, in the electrostatic chuck shown in FIGS. 1 and 2, the insulating member 15 is attached in such a manner as to be fit in a recessed portion formed on the back face of the ceramic base 11. However, another structure may be made in which, without the recessed portion formed on the back face of the ceramic base 11, the insulating member 15 is fixed to the ceramic base 11 on the same plane as the surface of the temperature control member 14. With this structure as well, an electrostatic chuck achieving high insulating performance and excellent uniformity of wafer temperature is obtained.

While preferred embodiments of the present invention have been described using specific terms, such description is for illustrative purposes, and it is to be understood that changes and variations may be made without departing from the spirit or scope of the claims.

What is claimed is:

1. An electrostatic chuck comprising:
a ceramic base having an electrode embedded approximately in parallel with and in vicinity to a holding face for holding a substrate;
a temperature control member in contact with a back face of the ceramic base;
a terminal inserted through an introduction hole formed in the back face, which is a reverse side of the holding face of the ceramic base, wherein the terminal extends perpendicular to the back face throughout the temperature control member, and is connected to the electrode; and
an insulating member made of high thermal conductivity ceramics, and having a thermal conductivity of not smaller than 100 W/m·K, wherein the insulating member is provided around the terminal and insulates the temperature control member from the terminal,
wherein the insulating member has a flange portion on an end portion in contact with the ceramic base, the insulating member extending a radial distance beyond the terminal such that it is radially larger in the flange portion than in a remaining portion of the insulating member extending through the temperature control member;
wherein a distance between the top surface of terminal and the holding face is shorter than a thickness of the temperature control member;
the temperature control member is made of metal;
a diameter of the flange portion is longer than the thickness of the ceramic base; and
a thickness of the flange portion is not smaller than 0.5 mm and not larger than 2 mm.

2. The electrostatic chuck according to claim 1, wherein a dielectric strength characteristic of the insulating member is not smaller than 5 kV/mm.

3. The electrostatic chuck according to claim 1, wherein a thickness of the flange portion of the insulating member is not smaller than 0.5 mm and not larger than 2 mm.

4. The electrostatic chuck according to claim 1, wherein the insulating member is fixed to the ceramic base with an adhesive having a high insulating property.

5. The electrostatic chuck according to claim 4, wherein dielectric voltage of the adhesive is not smaller than 10 kV/mm.

* * * * *

UNITED STATES PATENT AND TRADEMARK OFFICE
CERTIFICATE OF CORRECTION

PATENT NO.      : 7,576,967 B2                                           Page 1 of 1
APPLICATION NO. : 11/687824
DATED           : August 18, 2009
INVENTOR(S)     : Ikuhisa Morioka, Yasufumi Aihara and Hideyoshi Tsuruta It is certified that error appears in the above-identified patent and that said Letters Patent is hereby corrected as shown below:

Column 10

*Line 19:* please add --the-- before "terminal"

Signed and Sealed this

Eleventh Day of May, 2010

David J. Kappos
*Director of the United States Patent and Trademark Office*